United States Patent [19]

Jacoby

[11] Patent Number: 4,733,453
[45] Date of Patent: Mar. 29, 1988

[54] METHOD OF MAKING A MULTIPLE-PIN HEATSINK

[75] Inventor: John H. Jacoby, Providence, R.I.

[73] Assignee: PinFin, Inc., Warren, R.I.

[21] Appl. No.: 4,065

[22] Filed: Jan. 16, 1987

[51] Int. Cl.⁴ .............................................. B23P 11/00
[52] U.S. Cl. ................................. 29/432; 29/522 R; 29/798; 403/274; 165/185; 165/80.3
[58] Field of Search ................. 29/522 R, 523, 798, 29/509, 432; 403/274; 165/81, 185, 80.3

[56] References Cited

U.S. PATENT DOCUMENTS

| | | | |
|---|---|---|---|
| 418,198 | 12/1889 | Lemp et al. | 29/522 R UX |
| 1,900,099 | 3/1933 | Ferguson | 29/522 R UX |
| 2,163,683 | 6/1939 | Heller | 29/522 R UX |
| 2,366,756 | 1/1945 | Spencer | 29/522 R UX |
| 2,722,048 | 11/1955 | Gier, Jr. | 29/432 X |
| 2,955,351 | 10/1960 | McCreadie | 29/432 X |
| 3,257,708 | 6/1966 | Stricker | 29/522 R X |
| 3,327,779 | 6/1967 | Jacoby | 165/185 |
| 3,847,700 | 11/1974 | Dalol et al. | 29/432 X |
| 4,574,330 | 3/1986 | Cohen et al. | 165/185 X |

Primary Examiner—Charlie T. Moon
Attorney, Agent, or Firm—Joseph S. Iandiorio; William E. Noonan

[57] ABSTRACT

A method of making a multiple-pin heatsink which includes forming in the upper surface of a die member a plurality of pin-receiving holes, each with a depth which is less than the length of a respective pin and forming in a base element a plurality of pin-receiving holes which correspond to the pin holes in the die member. The pins are introduced into the holes in the die member and the base element is mounted on the upper surface of the die member so that each pin extends through and above a respective hole in the base element. Sufficient downward force is applied to the upper ends of the pins to cold swage the pins into permanent attachment with the base element and the attached pins and base element are then removed from the die member.

13 Claims, 10 Drawing Figures

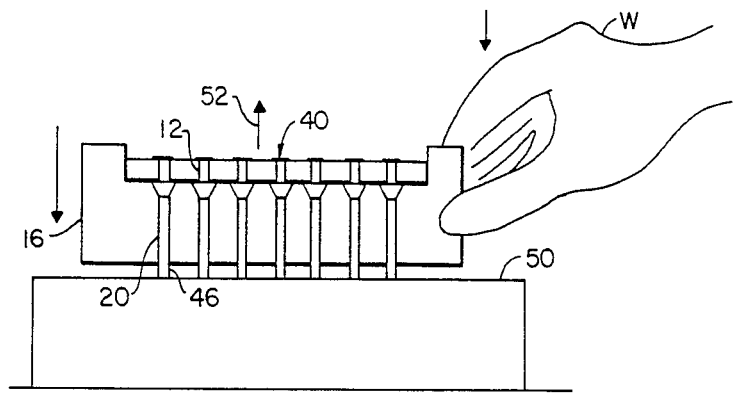
FIG. 6
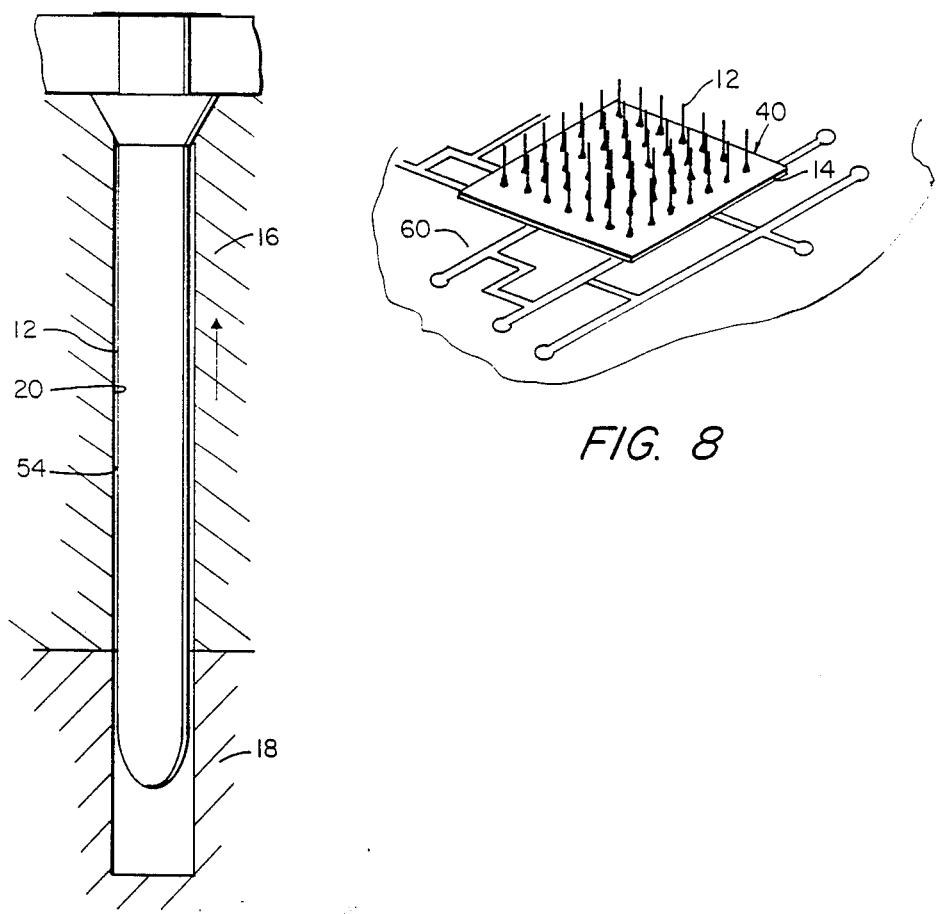
FIG. 7
FIG. 8

METHOD OF MAKING A MULTIPLE-PIN HEATSINK

FIELD OF INVENTION

This invention relates to a method of making a multiple-pin heat sink.

BACKGROUND OF INVENTION

Printed circuit boards and other electronic components often employ multiple-pin heatsinks to dissipate the heat that they generate. Typically such heatsinks include a base plate which is mounted to the circuit board and has a plurality of attached pins extending from its upper surface. The plate and pins are composed of a heat-dissipating metal alloy.

Conventional brazing, welding and casting techniques for manufacturing such multiple-pin heatsinks exhibit a number of disadvantages. For example, in one brazing method the pins are received through corresponding holes in a narrow jig or die so that the upper ends of the pins extend above and the lower ends extend below the die. A layer of brazing compound is then disposed between the upper ends of the pins and the base plate. The compound is heated to braze together the pins and base plate and finally the die is removed. This is a time consuming, tedious and relatively expensive procedure. Brazing compound must be purchased and properly applied; the pins must be held in place; and heat must be properly applied. Moreover, it is often quite difficult to maintain all of the pins perfectly parallel to one another. And if even one pin is mounted in a crooked manner the die becomes very difficult to remove.

Casting methods require expensive molds and heat sources. Furthermore, the metal alloys employed in the casting of multiple-pin heatsinks are typically limited to materials which are relatively poor conductors of heat. This problem is exacerbated by the casting process because porosity and granular structure are typically formed in the cast pins and base, thereby further reducing heat dissipation. And due to the surface tension of the molten pin material, it is extremely difficult to draw that material into the extremely narrow pin molds, even using a vacuum pump.

Welding techniques are likewise expensive, time consuming and complex and often provide less than optimum results.

SUMMARY OF INVENTION

It is therefore an object of this invention to provide a relatively simple, fast, inexpensive and efficient method of making an effective multiple-pin heatsink.

It is a further object of this invention to provide a method for making a multiple-pin heatsink which virtually eliminates skewed or crooked pins and facilitates removal of the completed heatsink from its die.

It is a further object of this invention to provide a method for making a multiple-pin heatsink which permits the employment of a variety of effective heat-dissipating metal alloys in the heatsink.

It is a further object of this invention to provide a method for making a multiple-pin heatsink which does not require generation of high heating temperatures and which does not form air pockets in the heatsink material.

It is a further object of this invention to provide a method for making a multiple-pin heatsink which enables the use of longer heat-dissipating pins.

The invention results from the realization that an improved method for making a multiple-pin heatsink may be provided by receiving the pins within holes extending partially but not completely through a die member, extending the upper ends of the pins through the base plate, and then applying downward pressure to cold swage or form the pins into attachment with the base plate. This invention results from the further realization that subsequent removal of the base plate and pins is facilitated by forming the holes in the die member to provide a slight draft or angle of, for example, two degrees between the sides of the holes and the sides of the received pins.

This invention features a method of making a multiple-pin heatsink which includes forming in the upper surface of a die member a plurality of pin-receiving holes, each with a depth which is less than the length of a respective pin. A plurality of pin-receiving holes which correspond to the pin holes in the die member are formed in a base element. The pins are introduced into the hole in the die member and the base element is mounted on the upper surface of the die member so that each pin extends through and above a respective hole in the base element. Sufficient pressure is applied to the upper ends of the pins to cold swage the pins into permanent attachment with the base element and the base element and the attached pins are then removed from the die member.

In a preferred embodiment, the holes in the die member are formed partially through the die member. The die member may include separable upper and lower portions and the pin holes may be formed completely through the upper portion and only partially through the lower portion. The base element and the attached pins may be removed from the die member by striking the bottom of the die member with sufficient force to urge the pins out of the holes in the die member. Where separable upper and lower die member portions are employed the pins may be removed by first separating the upper and lower portions of the die member and then urging the pins upwardly through and out of the upper portion such as by striking the distal ends of the pins with sufficient force to drive them through and out of the holes in the upper portion. The holes may be formed to provide a slight angle of, for example, approximately 2° between the side of each hole and the side of the pin which it receives.

The holes in the base may be formed before the pins are extended through the base element and the base element may be mounted on the upper surface of the die member before the pins are introduced into the die member and extended through the holes in the base element. Alternatively, the base element may be mounted on the upper surface of the die member and the pins may be extended through the holes in the base element following introduction of the pins into the holes of the die member. The die member may include lip means for containing the base element on the upper surface of the die member and centering the base element to align the pin-receiving holes in the base element with those in the die member.

The base element may be composed of a soft material and its pin-receiving holes may be formed by first introducing the pins into the holes in the die member and then urging the base element downwardly onto the upper ends of the pins.

DISCLOSURE OF PREFERRED EMBODIMENT

Other objects, features and advantages will result from the following description of a preferred embodiment and the accompanying drawings, in which:

FIG. 6 is an elevational cross-sectional view of a method of removing the heatsink from the die member;

FIG. 7 is an enlarged elevational cross-sectional view of a pin received by a respective hole of the die member;

FIG. 8 is an axonometric view of the completed heatsink in use on a printed circuit board;

Figure 1:
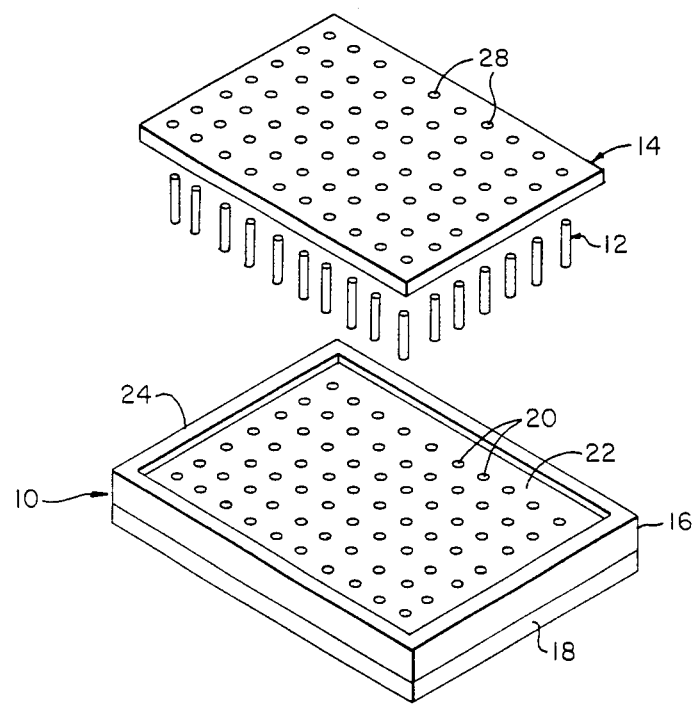
FIG. 1 is an axonometric view of the die member, pins and base element used to construct a multiple-pin heatsink according to the method of this invention.

A multiple-pin heatsink may be quickly, inexpensively and efficiently manufactured according to the method of this invention by forming in the upper surface of the die member a plurality of pin-receiving holes. Each hole has a depth which is less than the length of a respective pin. Preferably the die is formed from tool steel or die steel and includes separable upper and lower portions. Alternatively, a single piece die may be employed. The pin-receiving holes are formed partially through the die member. For example, they may be disposed completely through the upper portion but only partially through the lower portion of the die member.

A base element, typically including a thin sheet of copper, aluminum or similar material, is likewise provided with a plurality of pin-receiving holes which correspond to the pin holes in the die member. The pins themselves are preferably composed of copper or other suitable heat dissipating material. They are introduced into respective holes in the die member and the base element is mounted on the upper surface of the die member so that each pin extends through and above a respective hole in the base element. A lip may be provided around the upper surface of the die member for containing the base element on the die member and centering the base element to align the pin-receiving holes in the base element with those in the die member. The pins may be introduced into the die member either before or after the base element is mounted. In certain embodiments the pin-receiving holes are formed in the base element before the pins are extended through it. Alternatively, the base element may be composed of a soft material and the pin-receiving holes may be formed therein by first introducing the pins into the holes in the die member and then urging the base element downwardly onto the upper ends of the pins to pierce the base and form the pin holes.

Following mounting of the base element and introduction of the pins through the corresponding holes in the die member and base element, downward pressure is applied to the upper ends of the pins to cold swage the pins into permanent attachment with the base element. Sufficient pressure is applied to insure that the pins and base element are securely attached. Cold forming the pins to the base element enables the heatsink to be manufactured without requiring complicated, time-consuming and expensive welding or other heating procedures or similarly unsatisfactory casting techniques.

Following their permanent attachment, the base element and the pins are removed from the die member by, for example, striking the bottom of the die member with sufficient force to urge the pins out of the holes in the die member. Where a two-pieces die member is employed, such removal is typically performed by first separating the upper and lower portions of the die member. The pins are then urged upwardly through and out of the upper portion by, for example, striking the distal ends of the pins to drive them upwardly through the holes.

Because the pins are held for most of their length in the die member, they are largely prevented from bending or skewing and, as a result, removal from the die member is greatly facilitated. Removal is also made easier by forming the holes to provide a slight angle of, for example, approximately 2°, between the side of the hole and the side of the pin it receives. This angle reduces the frictional interference between the sides of the pin hole and the pin so that the pin may be withdrawn either by striking its distal end, striking the bottom of the die member or pulling upwardly on the base.

Because this technique does not rely on casting techniques, expensive molds and heat sources are not required and air pockets in the pins are greatly reduced. Furthermore, heatsinks with longer and better heat-dissipating pins are much easier to construct.

There is shown in FIG. 1 a die member 10, heat-dissipating pins 12, and a base element 14 which are employed to construct a heatsink according to the method of this invention. Die member 10 includes an upper portion 16 and a separably attached lower portion 18. An array of pin-receiving holes 20 are formed in the upper surface 22 of die member 10. Those holes extend completely through upper portion 16 but only partially through lower portion 18 of die member 10. A lip 24 which is integral with upper portion 16 extends peripherally about upper surface 22.

Figure 2:
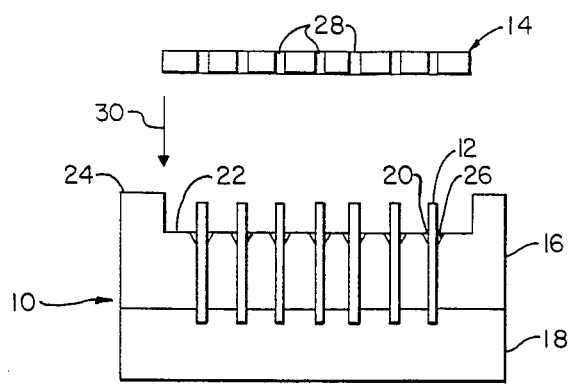
FIG. 2 is an elevational cross-sectional view of the die member with the pins received therein and a base element with predrilled holes for mounting on the die member.

Each pin-receiving hole 20 receives a respective pin 12 as shown more clearly in FIG. 2. Each pin 12 has a length which is slightly greater than the depth of its respective hole 20 so that the introduced pin extends above upper surface 22 of die member 10. Each pin-receiving hole 20 has a beveled opening 26.

Figure 3:
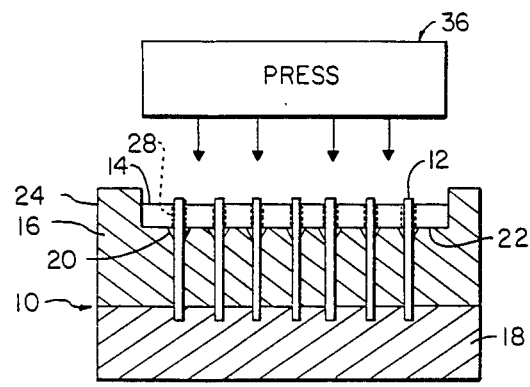
FIG. 3 is an elevational cross-sectional partially schematic view of pressure being applied to the upper ends of the pins to cold form the pins into attachment with the base element.

Base element 14 includes an array of pin-receiving holes 28 that are drilled or otherwise formed in the base element to correspond precisely to pin-receiving holes 20 in die member 10. Base element 14 is mounted on upper surface 22 of die member 10 by lowering it in the direction of arrow 30, FIG. 2, so that pins 12 extend through and above respective holes 28. Alternatively, base 14 may be mounted on the upper surface 22 of die member 10 before pins 12 are introduced through base element holes 28 and into die member holes 20. As shown in FIG. 3, lip 24 of die member 10 contains base element 14 on upper surface 22 of the die member and centers the base element to align pin-receiving holes 28 with complementary holes 20.

Figure 4:
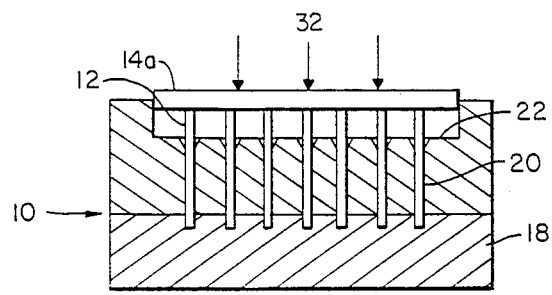
FIG. 4 is an elevational cross-sectional view of a base plate having its pin-receiving holes formed by pushing the base plate against the tops of the pins.

In an alternative embodiment, FIG. 4, base element 14a includes a soft metal material without the preformed holes of the previous embodiment. After pins 12 are introduced into holes 20 in die member 10, base 14a is placed on the surface defined by the top ends of the pins and a downward force 32 is applied to the base element. This causes the pin elements 12 to pierce the soft base element 14a and form holes at locations similar to those of holes 28, FIG. 3. At the same time, base 14a is mounted on the upper surface 22 of die member 10.

Figure 5:
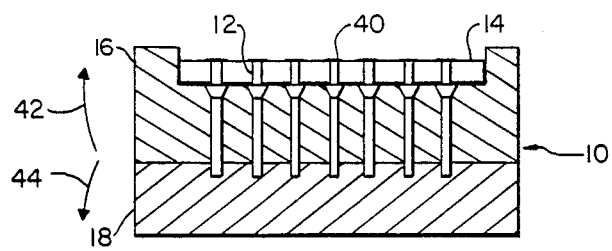
FIG. 5 is an elevational cross-sectional view of the die member with the multiple-pin heatsink mounted therein.

As shown in FIG. 3, after the pins 12 and base element 14 have been mounted to die member 10, a press 36 applies downward pressure of at least 1500 psi to the upper ends of pins 12 extending above base element 14. This cold swages pins 12 into permanent attachment with base element 14 as illustrated in FIG. 5. Each pin 12 is compressed into a bevelled opening 26 and flattened above base 14 so that the base is locked in place. As a result, a multiple pin heatsink 40 is formed.

After the pressure is lifted heatsink 40 is removed from die member 10 by first separating lower die portion 18 from upper die portion 16 in the direction of arrows 42 and 44. As a result, as shown in FIG. 6, the distal ends 46 of pins 12 extend below the bottom of upper portion 16. The worker W who is fabricating the multiple pin heatsinks then grasps upper member 16 and strikes distal ends 46 of pins 12 against the upper surface of bench 50 so that heatsink 40 is urged upwardly in the direction of arrow 52, through holes 20, and out of upper portion 16 of die member 10.

To facilitate removal of pins 12 from their respective die member holes 20 a slight angle 54, FIG. 7, of, for example, 2° is provided between the wall of hole 20 and the side of pin 12. As a result, when pin 12 is urged longitudinally upwardly frictional resistance between the side of the pin and the wall of hole 20 is reduced and removal is made much easier.

Following its removal from the die member, heatsink 40, FIG. 8, is mounted on a circuit board 60. Base 14 is placed directly on the circuit board and pins 12 extend upwardly from the base to dissipate heat generated by circuit board 60.

Figure 9:
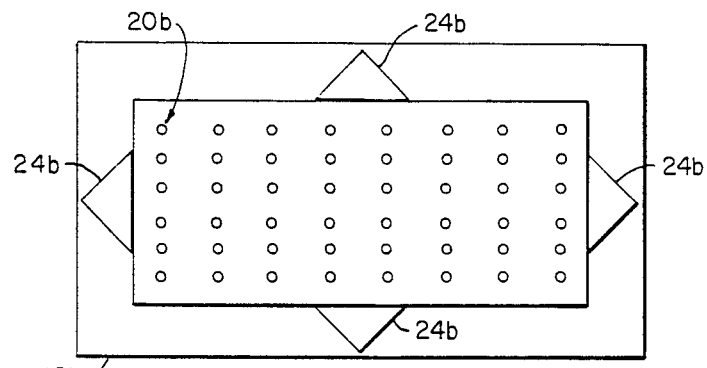
FIG. 9 is a top plan view of an alternative die member with a base element having predrilled holes mounted thereon.
Figure 10:
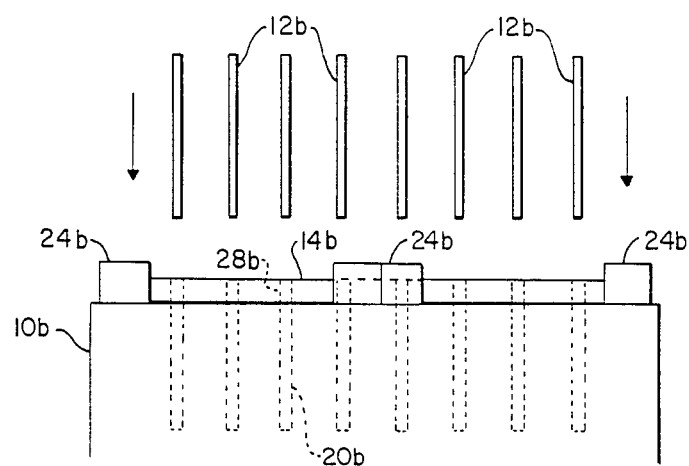
FIG. 10 is a front elevational view illustrating the die member and base element of FIG. 9 and the introduction of the pins through the base element into the die member.

In an alternative method, FIG. 9, die member 10b is provided with, for example, triangular lip elements 24b which are spaced peripherally about an array of pin-receiving holes 20b. As shown in FIG. 10, lip elements 24b serve to contain base 14b on the upper surface of die member 10b and center the base element so that pin-receiving holes 28b in base element 14b are aligned with pin-receiving holes 20b in die member 10b. Pins 12b are then introduced into the aligned die member and base element holes or, alternatively, are introduced into the die member holes 20b before base element 14b is mounted on them.

Although specific features of the invention are shown in some drawings and not other, this is for convenience only as each feature may be combined with any or all of the other features in accordance with the invention.

Other embodiments will occur to those skilled in the art and are within the following claims:

What is claimed is:

1. A method of making a multiple-pin heatsink comprising:
    forming in the upper surface of a die member a plurality of pin-receiving holes, each with a depth which is less than the length of a respective pin;
    forming in a base element a plurality of pin-receiving holes which correspond to the pin holes in said die member;
    introducing the pins into the holes in said die member and mounting said base element on the upper surface of said die member so that each said pin extends through and above a respective hole in said base element;
    applying sufficient downward pressure to the upper ends of said pins to cold swage and expand said pins into permanent attachment above and below said base element; and
    removing said base element and said attached pins from said die member.

2. The method of claim 1 in which the holes in said die member are formed partially through said die member.

3. The method of claim 1 further including using a die member which includes separable upper and lower portions and forming the pin-receiving holes completely through said upper portion and only partially through said lower portion.

4. The method of claim 3 in which said base element and said attached pins are removed from said die member by first separating said upper and lower portions of said die member and then urging said pins upwardly through and out of said upper portion.

5. The method of claim 3 in which said pins are urged upwardly by striking the distal ends of said pins with sufficient force to drive them through and out of the holes in the upper portion.

6. The method of claim 1 in which said base element and attached pins are removed from said die member by striking the bottom of said die member with sufficient force to urge said pins out of the holes in said die member.

7. The method of claim 1 further including forming the holes to provide a slight angle between the side of each said hole and the side of the pin which it receives.

8. The method of claim 7 in which the angle formed is approximately 2°.

9. The method of claim 1 further including providing said die member with lip means for containing said base element on the upper surface of said die member and centering said base element to align the pin-receiving holes in said base element with those in said die member.

10. The method of claim 1 in which the holes in said base element are formed therein before said pins are extended through said base element.

11. The method of claim 10 in which said base element is mounted on the upper surface of said die member before said pins are introduced into said die member and extended through the holes in said base element.

12. The method of claim 10 in which said base element is mounted on the upper surface of said die member and said pins are extended through the holes in said base element following introduction of said pins into the holes of said die member.

13. The method of claim 1 further including using a base element composed of a soft material and in which said holes in said base element are formed by first introducing the pins into the holes in said die members and then urging said base element downwardly onto the upper ends of said pins.

* * * * *